(12) United States Patent
English et al.

(10) Patent No.: US 7,084,356 B2
(45) Date of Patent: Aug. 1, 2006

(54) REPLACEMENT COVER FOR ELECTROMAGNETIC SHIELDING SYSTEM

(75) Inventors: Gerald R. English, Glen Ellyn, IL (US); Mark Weiske, Round Lake, IL (US)

(73) Assignee: Laird Technologies, Inc., Delaware Water Gap, PA (US)

( * ) Notice: Subject to any disclaimer, the term of this patent is extended or adjusted under 35 U.S.C. 154(b) by 28 days.

(21) Appl. No.: 11/005,057

(22) Filed: Dec. 6, 2004

(65) Prior Publication Data

US 2005/0121212 A1    Jun. 9, 2005

Related U.S. Application Data

(60) Provisional application No. 60/527,786, filed on Dec. 8, 2003.

(51) Int. Cl.
*H05K 9/00*    (2006.01)

(52) U.S. Cl. .................. 174/361; 361/816; 361/818

(58) Field of Classification Search .............. 174/35 R, 174/35 MS, 350, 361; 361/800, 816, 818
See application file for complete search history.

(56) References Cited

U.S. PATENT DOCUMENTS

| | | | |
|---|---|---|---|
| 6,136,131 A | | 10/2000 | Sosnowski |
| 6,175,077 B1 | * | 1/2001 | Mendolia et al. ......... 174/35 R |
| 6,178,097 B1 | | 1/2001 | Hauk, Jr. |
| 6,384,324 B1 | | 5/2002 | Flegeo |
| 6,483,719 B1 | * | 11/2002 | Bachman .................. 174/35 R |
| 6,501,016 B1 | | 12/2002 | Sosnowski |
| 6,668,449 B1 | * | 12/2003 | Rumsey et al. ............... 29/840 |
| 2004/0022046 A1 | * | 2/2004 | Leerkamp et al. .......... 361/816 |
| 2005/0068758 A1 | * | 3/2005 | Blersch ...................... 361/818 |
| 2005/0254224 A1 | * | 11/2005 | Fagrenius et al. .......... 361/800 |

FOREIGN PATENT DOCUMENTS

| | | | |
|---|---|---|---|
| JP | 03154398 A | * | 7/1991 |
| WO | WO 2005/057995 | | 6/2005 |

* cited by examiner

*Primary Examiner*—William H. Mayo
*Assistant Examiner*—Adolfo Nino
(74) *Attorney, Agent, or Firm*—Harness, Dickey & Pierce, P.L.C.

(57) ABSTRACT

The replacement lid for an electromagnetic shielding device is generally planar with stenciled solder segments formed immediately inwardly adjacent from the periphery thereof. The replacement lid is installed onto an electromagnetic shielding device by placing the stenciled solder segments against the walls of the electromagnetic shielding device so that the unstenciled side of the replacement lid is exposed. The installer then applies a heat source to the unstenciled side of the replacement lid thereby melting the solder and forming a bond between the replacement lid and the shielding device. The replacement lid may be manufactured by securing the replacement lid between a platen and a stencil and using a squeegee to apply solder paste through the stencil onto the replacement lid.

34 Claims, 6 Drawing Sheets

REPLACEMENT COVER FOR ELECTROMAGNETIC SHIELDING SYSTEM

This application claims priority of U.S. provisional application Ser. No. 60/527,786, filed on Dec. 8, 2003.

BACKGROUND OF THE INVENTION

1. Field of the Invention

The invention pertains to a replacement cover for an electromagnetic shielding system wherein solder is applied to the cover during manufacturing, and wherein the replacement cover is placed on the shield and fused to the shield by the user applying a heat source.

2. Description of the Prior Art

An example of prior art for replacing the lid of an electromagnetic shielding device is found in U.S. Pat. No. 6,501,016, entitled "Electromagnetic Shielding System for Printed Circuit Board" issued on Dec. 31, 2002 to Sosnowski. This reference discloses the repair of an electromagnetic shielding system wherein the replacement cover is a metal foil with an adhesive surface. Alternatively, a mechanical locking system can be used.

While this reference discloses a method and apparatus which have been satisfactory in many respects, further improvements are sought, particularly with providing a more secure bond between the shielding device and the replacement cover. Moreover, the use of a mechanical locking system was, on occasion, not practical when there was limited clearance around the shielding device.

Additionally, prior attempts at using solder have not proved to be practical. Using conventional manual soldering techniques on-site was not practical as the amount of solder was not controlled or repeatable and could lead to components shorting from overflowed solder or electrical leaks or mechanical deficiencies due to too little solder. Moreover, such conventional manual techniques were very time consuming.

OBJECTS AND SUMMARY OF THE INVENTION

It is therefore an object of the present invention to provide a replacement lid for an electromagnetic shielding device wherein the connection between the replacement lid and the shielding device is secure.

It is therefore a further object of the present invention to provide a replacement lid for an electromagnetic shielding device which does not require any substantially increased clearance over the shielding device.

It is therefore a still further object of the present invention to provide a replacement lid for an electromagnetic shielding device wherein the risk of shorting or otherwise damaging the shielded components is substantially eliminated.

It is therefore a still further object of the present invention to provide a replacement lid for an electromagnetic shielding device wherein the replacement lid can be installed quickly and reliably, without a high level of skill being involved on the part of the user.

These and other objects are attained by providing a replacement lid for an electromagnetic shielding device. The replacement lid is generally planar, possibly with embossed raised surfaces, with stenciled solder segments formed immediately inwardly adjacent from the periphery thereof. The replacement lid is installed onto an electromagnetic shielding device by placing the stenciled solder segments against the walls of the electromagnetic shielding device so that the unstenciled side of the replacement lid is exposed. The installer then applies a heat source to the unstenciled side of the replacement lid thereby melting the solder and forming a bond between the replacement lid and the shielding device. The replacement lid may be manufactured by securing the replacement lid between a platen and a stencil and using a squeegee to apply solder through the stencil onto the replacement lid.

BRIEF DESCRIPTION OF THE DRAWINGS

Further objects and advantages of the invention will become apparent from the following description and claims and from the accompanying drawings, wherein:

DETAILED DESCRIPTION OF THE PREFERRED EMBODIMENT

Figure 1:
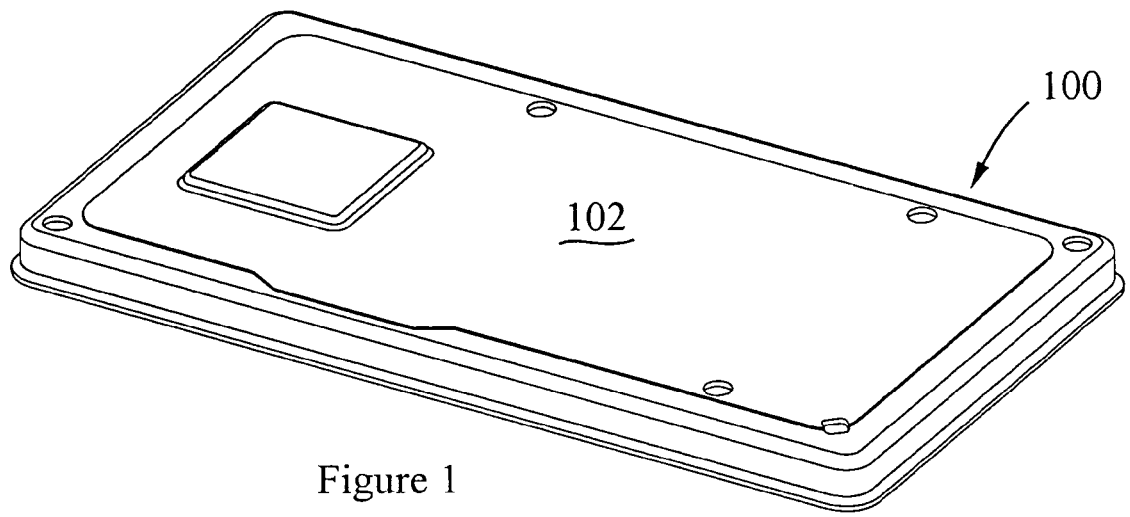
FIG. 1 is a perspective view of the shielding can, prior to removal of the scored section.
Figure 2:
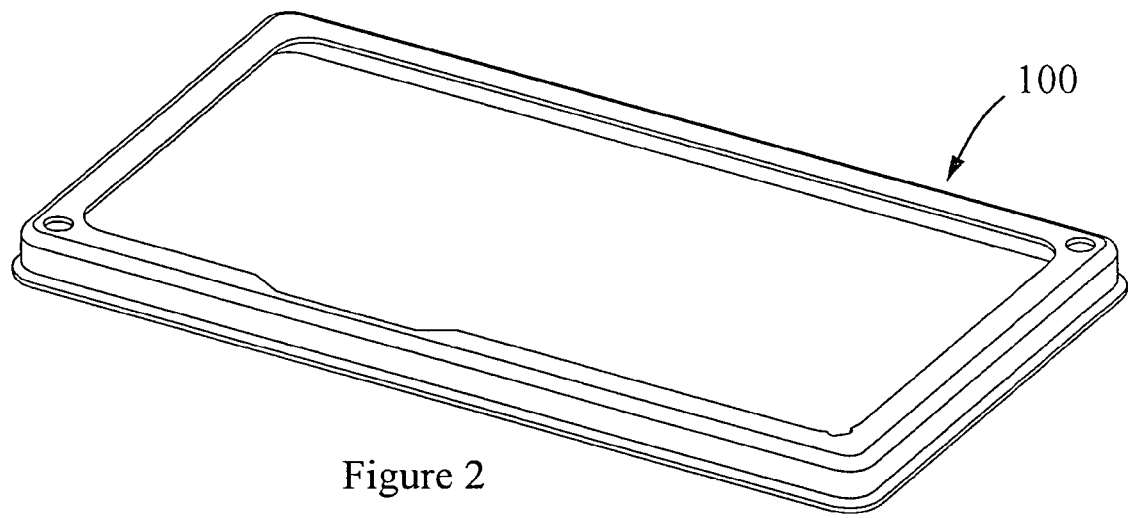
FIG. 2 is a perspective view of the shielding can, after removal of the scored section.

Referring now to the drawings in detail, wherein like numerals refer to like elements throughout the several views, one sees that FIGS. 1 and 2 are perspective view of the shielding can 100, before and after, respectively, removal of the scored lid section 102.

Figure 3:
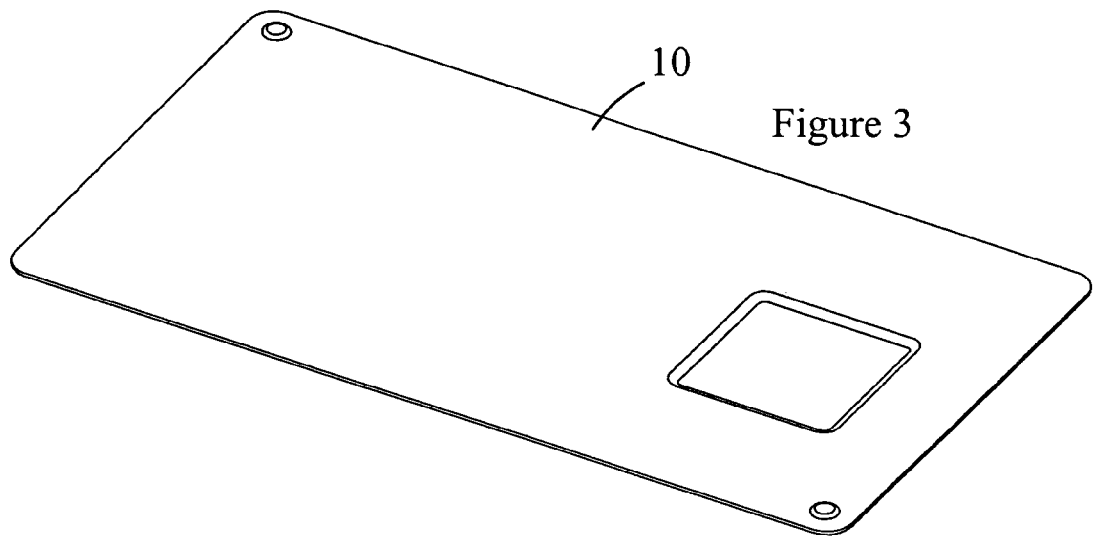
FIG. 3 is a perspective view of the replacement cover of the present invention, prior to the application of the solder paste.
Figure 4:
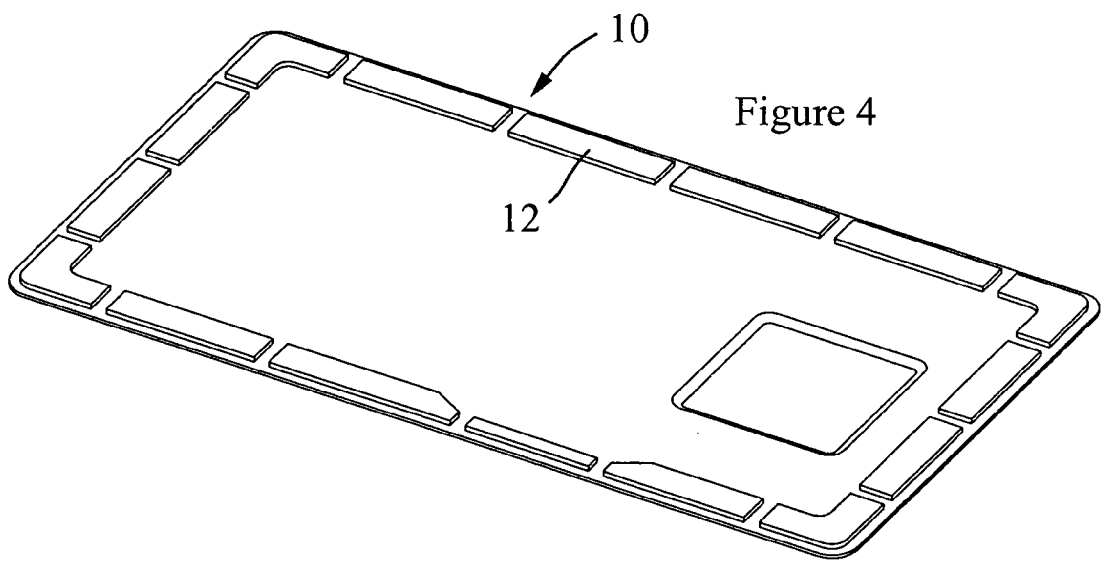
FIG. 4 is a perspective view of the replacement cover of the present invention, after stencil application of the solder paste thereto.

FIGS. 3 and 4 are perspective views of the replacement lid 10 of the present invention, before and after, respectively, the application of the stenciled solder segments 12. Replacement lid 10 is generally planar and typically square or rectangular, or whatever shape is required for the specific installation. Moreover, replacement lid 10 is typically made from conductive sheet metal to maintain the electromagnetic shielding and thermal conductivity and further to result in low costs, both for materials and manufacturing. Inwardly adjacent from the periphery of replacement lid 10 are stenciled solder segments 12. Stenciled solder segments 12 are sized and configured to match the outline of the shielding device 100 (see FIGS. 1, 2, 8 and 9) to which the replacement lid 10 is to be attached. There are gaps formed between the solder segments 12, both to provide a space for any excess solder to flow during installation and further to provide for a structurally sound stencil 200 (see FIGS. 4–6).

Figure 10:
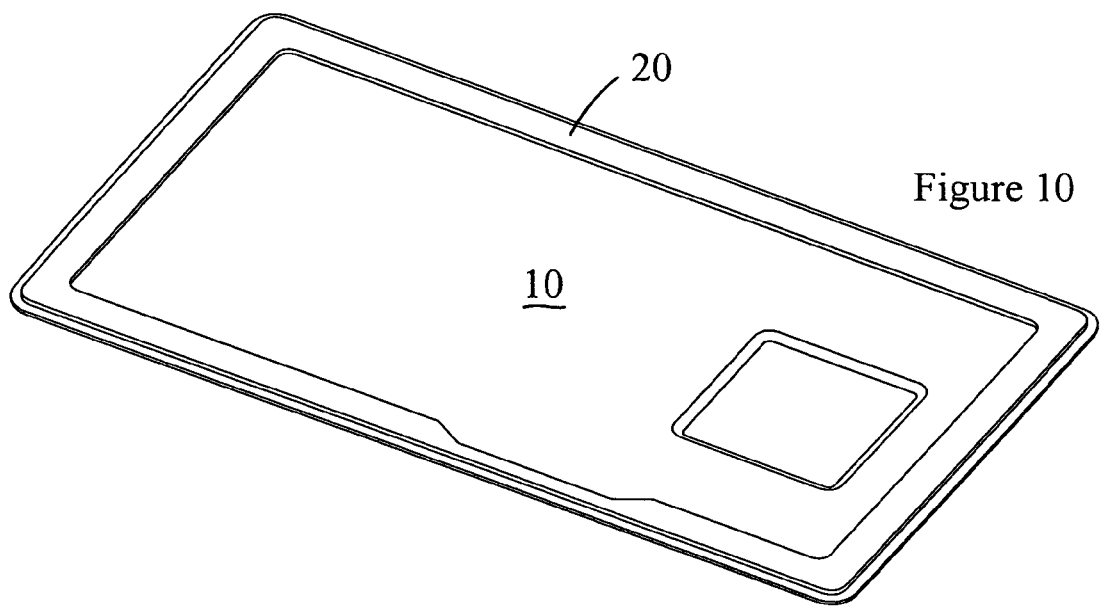
FIG. 10 is a perspective view of the replacement cover of the present invention with the solder pre-form attached.
Figure 11:
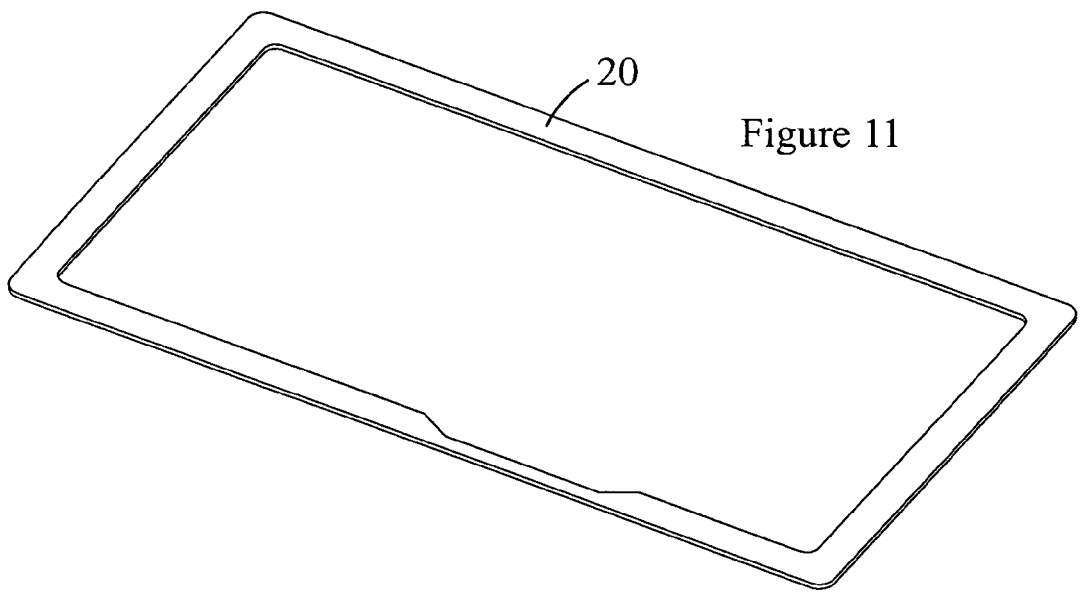
FIG. 11 is a perspective view of the solder pre-form of the present invention.

Alternatively, a solder pre-form 20 can be used, as shown in FIGS. 10 and 11, in place of the solder segments 12. The solder pre-form 20 is typically manufactured by die-cutting a foil-like sheet of solder paste or similar material into the desired shape.

To install replacement lid 10 to shielding device 100, the installer aligns and places the stenciled solder segments 12 against the walls of the open shielding device 100 so that the solder is against the shielding device and the reverse unstenciled side of the replacement lid 10 is facing outwardly. The user then applies a heat source, such as a soldering iron or heat gun, to the reverse unstenciled side of the replacement lid 10 so that the solder segments 12 melt and secure the replacement lid 10 to the shielding device 100.

Figure 5:
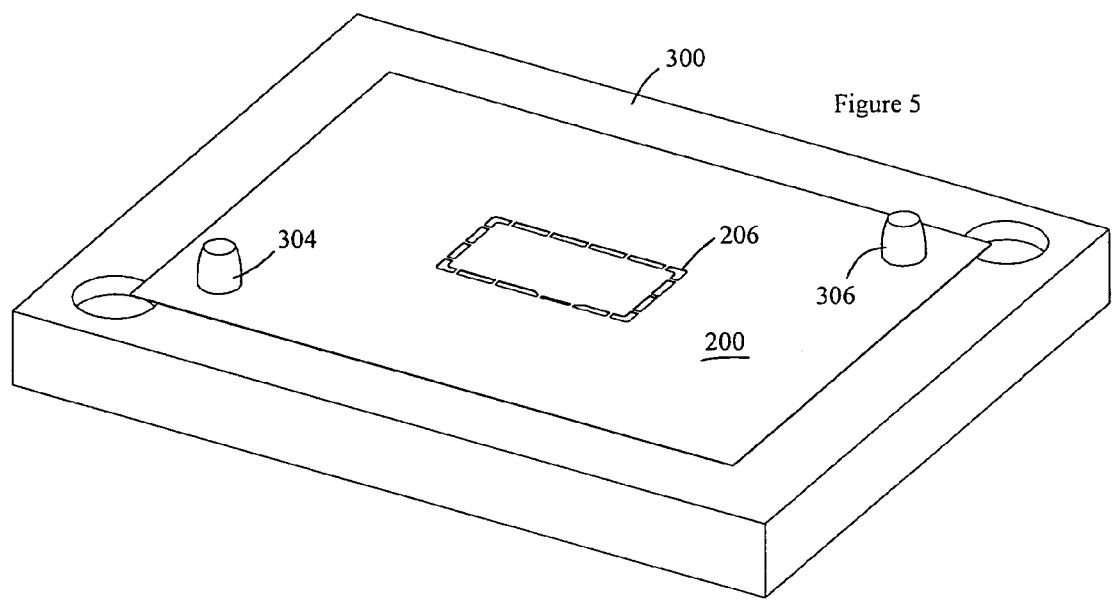
FIG. 5 is a perspective view of the paste application fixture in the closed state.
Figure 6:
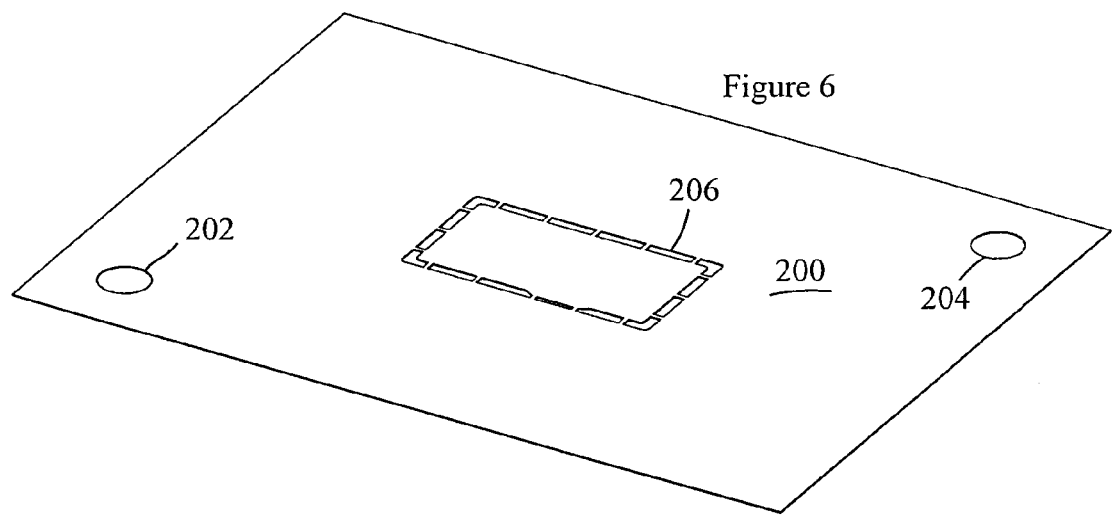
FIG. 6 is a perspective view of the stencil of the paste application fixture.
Figure 7:
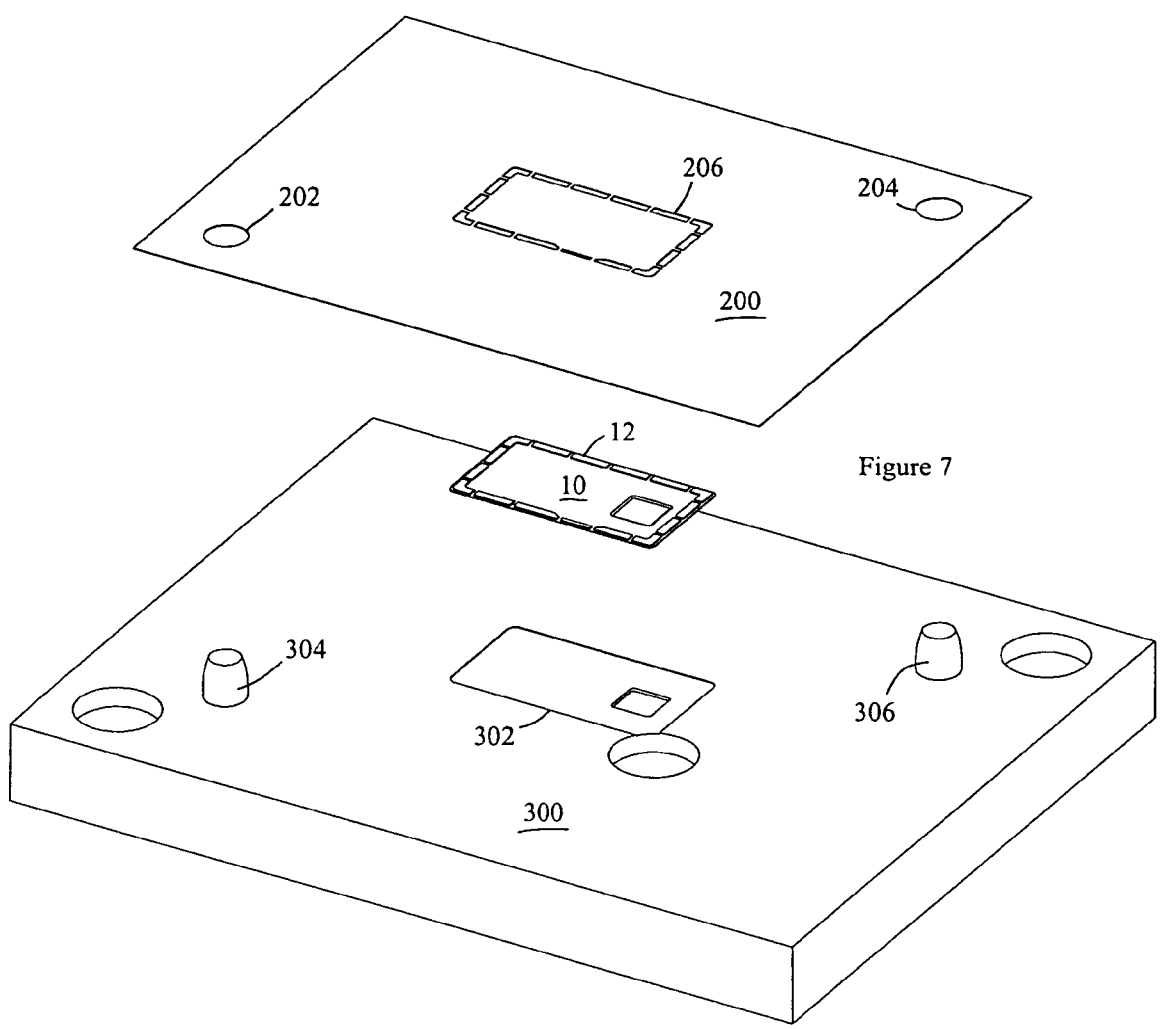
FIG. 7 is a perspective view of the paste application fixture.
Figure 8:
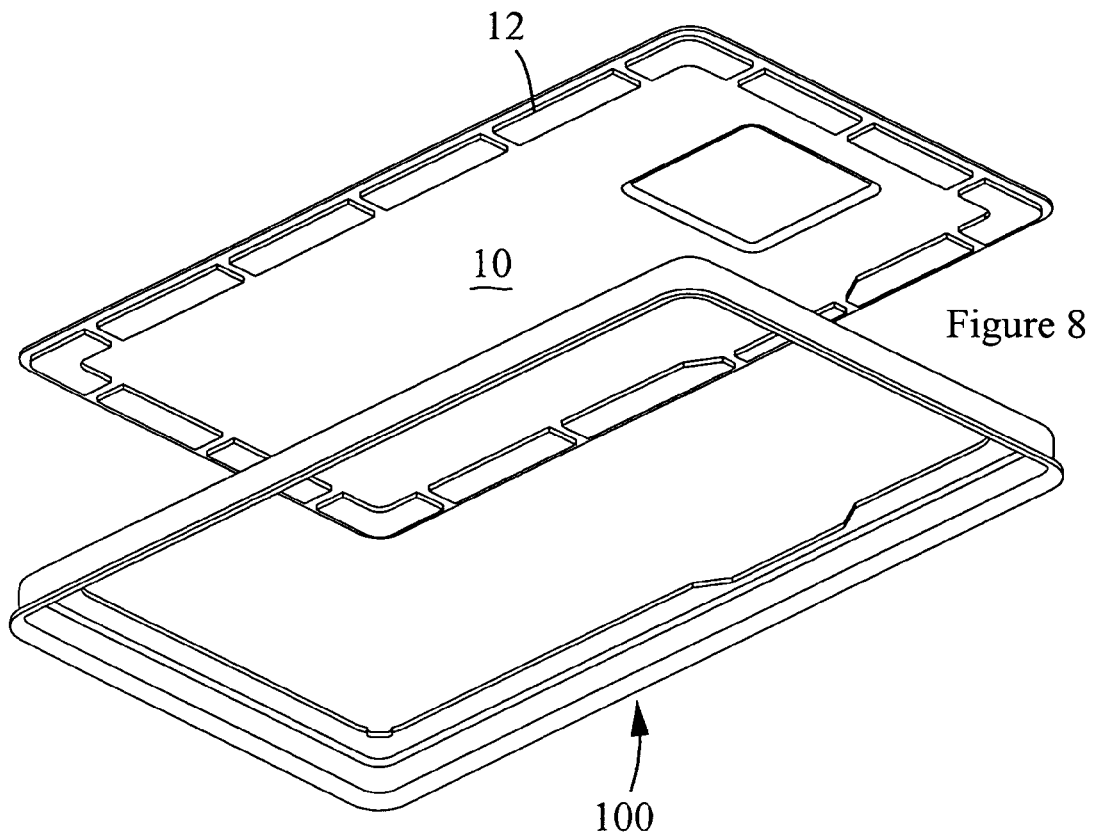
FIG. 8 is an exploded view of the finished replacement cover of the present invention over the open-top shielding can.
Figure 9:
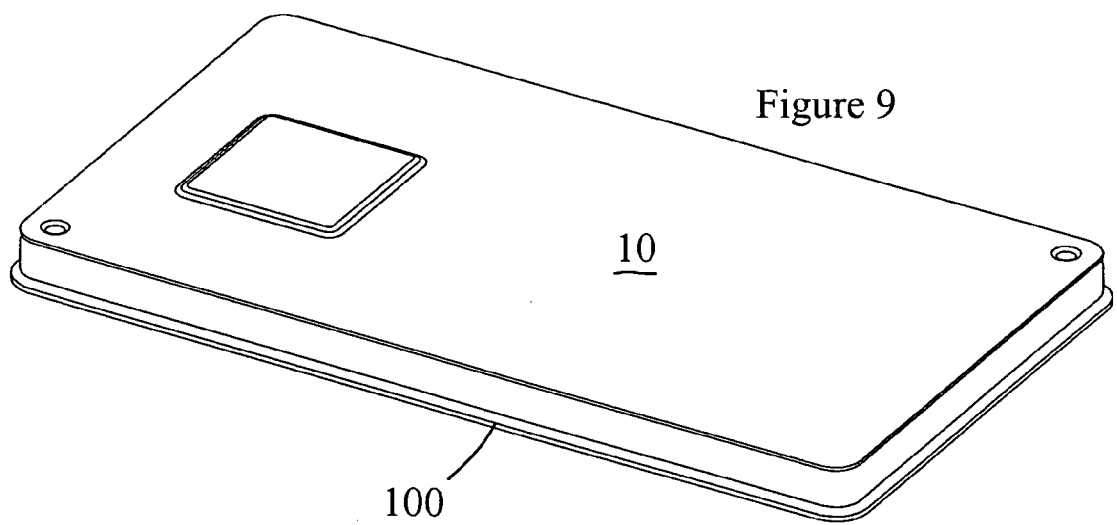
FIG. 9 is a perspective view of the shielding can with the replacement cover of the present invention mounted thereon.

In order to apply the stenciled solder segments 12 to the replacement lid 10 during the initial manufacturing process, as shown in FIGS. 5–7, the replacement lid 10 (at this stage, a piece of sheet metal without the stenciled solder segments applied) is placed onto a platen 300 which has a central recess 302 for capturing the replacement lid 10 and cylindrical guides 304, 306 for aligning with similar apertures 202, 204 of stencil 200 thereby securing replacement lid 100 between platen 300 and stencil 200. Stencil 200 has stencil pattern 206 thereon so that a squeegee (not shown) can be used to apply a controlled amount of solder paste through stencil pattern 206 thereby forming stenciled solder segments 12.

Thus the several aforementioned objects and advantages are most effectively attained. Although a single preferred embodiment of the invention has been disclosed and described in detail herein, it should be understood that this invention is in no sense limited thereby and its scope should be determined by that of the appended claims.

What is claimed is:

1. A lid for attachment to an electromagnetic shielding device for covering an opening defined by an upper portion of the electromagnetic shielding device to allow for shielding of one or more electrical components of a board within an interior defined by the lid and the electromagnetic shielding device, the lid comprising:
    a periphery, an interior side and an exterior side; and
    solder formed on said interior side inwardly adjacent said periphery prior to installation of the lid to an electromagnetic shielding device.

2. The lid of claim 1 wherein said solder is formed in a plurality of solder segments with gaps therebetween.

3. The lid of claim 2 wherein said solder is stenciled onto said interior side.

4. The lid of claim 2 wherein the solder segments are configured to generally correspond with an outline defined by the upper portion of the electromagnetic shielding device.

5. The lid of claim 2 wherein the gaps are configured to provide sufficient spacing for excess solder to flow.

6. The lid of claim 1 wherein said lid is intended as a replacement lid for an electromagnetic shielding device.

7. The lid of claim 1 wherein the lid is heated from said exterior side to melt said solder to attach the lid to an electromagnetic shielding device.

8. The lid of claim 1 wherein said lid is planar.

9. The lid of claim 8 wherein said lid is square or rectangular.

10. The lid of claim 1 wherein said lid is made of sheet metal.

11. The lid of claim 1 wherein the solder is formed on the interior side of the lid such that the solder generally corresponds with an outline defined by the upper portion of the electromagnetic shielding device.

12. A method of attaching a replacement lid to an electromagnetic shielding device, comprising the steps of:
    positioning a replacement lid on an electromagnetic shielding device to generally cover an opening defined by the electromagnetic shielding device, the replacement lid having a periphery, an interior side, an exterior side, and solder disposed on said interior side inwardly adjacent said periphery; and
    heating said exterior side of said replacement lid, thereby causing said solder to melt and subsequently secure said replacement lid to the electromagnetic shielding device.

13. The method of claim 12 wherein said solder is formed in a plurality of solder segments with gaps therebetween.

14. The method of claim 12 wherein said solder is stenciled onto said interior side.

15. The method of claim 12 wherein said lid is planar.

16. The method of claim 15 wherein said lid is square or rectangular.

17. The method of claim 12 wherein said lid is made of sheet metal.

18. The method of claim 12 further comprising removing an existing lid section from the electromagnetic shielding device to thereby define a remaining perimeter rim, and wherein positioning the replacement lid includes positioning the replacement lid relative to the remaining perimeter rim to generally cover the opening defined by the remaining perimeter rim.

19. The method of claim 12 further comprising mounting the electromagnetic shielding device to a board such that one or more electrical components of the board are disposed within an interior defined by the electromagnetic shielding device mounted to the board and the replacement lid secured to the electromagnetic shielding device.

20. A method of manufacturing a replacement lid for attachment to an electromagnetic shielding device for covering an opening defined by the electromagnetic shielding device, comprising the steps of:
    applying a stencil having a pattern of intended stenciled solder segments to an interior side of a replacement lid, the replacement lid also having a periphery and an exterior side; and
    stenciling solder segments to said interior side of said replacement lid through said stencil.

21. The method of claim 20 wherein stenciling solder segments comprises squeegeeing solder through the stencil pattern onto the interior side of the replacement lid.

22. The method of claim 20 wherein the method includes securing the replacement lid generally between a platen and the stencil, and squeegeeing solder through the stencil pattern onto the interior side of the replacement lid.

23. The method of claim 20 further comprising shipping the replacement lid after stenciling the solder segments to the interior side of the replacement lid.

24. A method of attaching a replacement lid to an electromagnetic shielding device, comprising the steps of:
    positioning a solder pre-form between the electromagnetic shielding device and a replacement lid having a periphery, an interior side and an exterior side, whereby said solder pre-form contacts said interior side of said replacement lid inwardly adjacent from said periphery of said lid; and
    heating said exterior side of said replacement lid, thereby causing said solder pre-form to melt and subsequently secure said replacement lid to the electromagnetic shielding device such that the replacement lid generally covers an opening defined by the electromagnetic shielding device.

25. The method of claim 24 wherein said lid is planar.

26. The method of claim 25 wherein said lid is square or rectangular.

27. The method of claim 24 wherein said lid is made of sheet metal.

28. A lid for attachment to an open-top electromagnetic shielding can having walls defining an opening, the lid comprising a periphery, an interior side, an exterior side, and solder disposed on the interior side inwardly adjacent the periphery, prior to attachment of the lid to the open-top electromagnetic shielding can, for soldering the lid to at least a portion of the walls such that the lid generally covers the opening to thereby allow for shielding of one or more electrical components of a board within an interior defined by the lid and the open-top electromagnetic shielding.

29. An electromagnetic shielding assembly comprising the lid of claim 28, and an open-top electromagnetic shielding can.

30. An electromagnetic shielding assembly comprising the lid of claim 28, and an electromagnetic shielding can with an integral top surface having an interior portion configured for removal to thereby define a remaining perimeter rim, and wherein the lid is solderable to the remaining perimeter rim for generally covering the opening defined by the remaining perimeter rim.

31. An electromagnetic shielding assembly comprising the lid of claim 28, and an electromagnetic shielding can having a scored lid section configured for removal to thereby define a remaining perimeter rim, and wherein the lid is solderable to the remaining perimeter rim for generally covering the opening defined by the remaining perimeter rim.

32. The electromagnetic shielding assembly of claim 31, wherein the remaining perimeter rim is defined at least partially by flanges inwardly extending from the walls of the electromagnetic shielding can.

33. The electromagnetic shielding assembly of claim 31, wherein the solder is formed on the interior side of the lid such that the solder generally corresponds in size and shape to the remaining perimeter rim.

34. A method for shielding and obtaining access to one or more electrical components of a board encompassed by an electromagnetic shielding enclosure mounted to the board, the method comprising:
  removing a removable lid section of the electromagnetic shielding enclosure thereby defining an opening into the electromagnetic shielding enclosure for allowing access to the one or more electrical components;
  positioning a replacement lid relative to the electromagnetic shielding enclosure to generally cover the opening, the replacement lid having a periphery, an interior side, an exterior side, and solder disposed on the interior side inwardly adjacent the periphery; and
  heating the exterior side of the replacement lid to melt the solder and subsequently secure the replacement lid to the electromagnetic shielding enclosure to thereby replace the removed lid section for encompassing and shielding the one or more electrical components disposed within an interior defined by the replacement lid and the electromagnetic shielding enclosure mounted to the board.

* * * * *